(12) United States Patent
Avayu et al.

(10) Patent No.: US 8,630,427 B2
(45) Date of Patent: Jan. 14, 2014

(54) TELECOMMUNICATIONS TERMINAL AND METHOD OF OPERATION OF THE TERMINAL

(75) Inventors: Itzhak Avayu, Mevasseret Tzion (IL); Uzi Cohen, Petah-Tikva (IL); Boaz Or-Shraga, Gush Dan (IL)

(73) Assignee: Motorola Solutions, Inc., Schaumburg, IL (US)

( * ) Notice: Subject to any disclaimer, the term of this patent is extended or adjusted under 35 U.S.C. 154(b) by 1138 days.

(21) Appl. No.: 12/159,110

(22) PCT Filed: Dec. 15, 2006

(86) PCT No.: PCT/US2006/062134
§ 371 (c)(1),
(2), (4) Date: Jan. 29, 2009

(87) PCT Pub. No.: WO2007/076299
PCT Pub. Date: Jul. 5, 2007

(65) Prior Publication Data
US 2011/0200200 A1 Aug. 18, 2011

(30) Foreign Application Priority Data
Dec. 29, 2005 (GB) .................................. 0526487.4

(51) Int. Cl.
*H04B 15/00* (2006.01)
(52) U.S. Cl.
USPC ............................ 381/94.1; 381/57; 381/58
(58) Field of Classification Search
USPC ............ 381/94.1–94.4, 1–4, 98, 71.1, 71.14, 381/111–115, 106, 107, 58, 57; 704/224–226; 379/387.01, 395, 379/390.03; 455/550.1, 414.1, 67.11, 501, 455/504–506
See application file for complete search history.

(56) References Cited

U.S. PATENT DOCUMENTS

| | | | |
|---|---|---|---|
| 4,829,565 A | 5/1989 | Goldberg | |
| 6,766,176 B1 * | 7/2004 | Gupta et al. ................ | 455/550.1 |
| 7,483,831 B2 * | 1/2009 | Rankovic ....................... | 704/225 |
| 2003/0002659 A1 * | 1/2003 | Erell ......................... | 379/387.01 |
| 2004/0057586 A1 | 3/2004 | Licht | |
| 2004/0125962 A1 | 7/2004 | Christoph | |
| 2004/0143433 A1 * | 7/2004 | Marumoto et al. ........... | 704/225 |
| 2005/0114127 A1 | 5/2005 | Rankovic | |

FOREIGN PATENT DOCUMENTS

| | | |
|---|---|---|
| EP | 0993670 B1 | 3/2002 |
| JP | 2001024459 | 1/2001 |
| WO | WO2005011111 | 2/2005 |

OTHER PUBLICATIONS

Supplementary European Search Report Dated Aug. 13, 2009.
International Search Report and Written Opinion for counterpart International Application No. PCT/US2006/62134 mailed on Nov. 19, 2007.

(Continued)

*Primary Examiner* — Lun-See Lao
(74) *Attorney, Agent, or Firm* — Anthony P. Curtis; Daniel R. Bestor (57) ABSTRACT

A telecommunications terminal (100) includes an input audio transducer (111), a receiver (101) for receiving an electrical signal representing a transmitted audio signal, a noise energy estimator (117) for estimating an audio noise energy input received by the input audio transducer and an audio enhancement means (108) for applying to the received electrical signal in a selected audio frequency band a gain which is greater than the gain applied to audio frequencies of the received electrical signal outside the selected band, the gain applied being a function of the audio noise energy input.

16 Claims, 5 Drawing Sheets

(56) References Cited

OTHER PUBLICATIONS

International Preliminary Report on Patentability for counterpart International Application No. PCT/US2006162134 mailed on Jul. 10, 2008.

Notice of Allowance for counterpart European Application No. EP06846632 mailed on Sep. 10, 2010.

Office Action for counterpart European Application No. EP06846632 mailed on Nov. 4, 2009.

* cited by examiner

TELECOMMUNICATIONS TERMINAL AND METHOD OF OPERATION OF THE TERMINAL

FIELD OF THE INVENTION

The present invention relates to a telecommunications terminal and a method of operation of the terminal. In particular, the invention relates to a terminal for communication of audio information.

BACKGROUND OF THE INVENTION

A common problem experienced by users of telecommunications terminals for audio communication is difficulty in hearing properly a received audio message when the user is listening to the message in a noisy environment. There are many instances where this problem arises, for example at a large railway station, at an airport, in a busy street, in a noisy factory or in a gathering of people, e.g. at a conference. The terminal being used might for example be a mobile telephone or portable radio or it could be a landline telephone handset.

There are ways well known in the prior art of enhancing a signal received by a telecommunications terminal so that the user is better able to hear the communicated audio information, particularly in the presence of background noise. Generally, these involve adaptive and non-adaptive methods of enhancing the gain of the received signal. Where the gain has a maximum setting and is adjusted to reach the maximum setting no further signal enhancement is obtained. Alternatively, if the gain is not limited to a maximum setting, enhancing beyond a particular level will significantly distort the received signal.

Systems are known, e.g. from US 2004/0057586, wherein the spectrum of the received signal is analysed and the signal to noise ratio of components of the spectrum are determined. Components having a low signal to noise ratio are enhanced by an increased gain. This procedure does not however take into account the noise level in the user's environment at the receiving terminal.

SUMMARY OF THE INVENTION

A telecommunications terminal and method of operation of the terminal is provided. The telecommunications terminal includes an input audio transducer, a receiver, a noise energy estimator, an audio enhancer, and a processor. The receiver receives an electrical signal representing a transmitted audio signal. The noise energy estimator estimates an audio noise energy input received by the input audio transducer. The audio enhancer applies to the received electrical signal in a selected audio frequency band corresponding to speech a gain which is greater than the gain applied to audio frequencies of the received electrical signal outside the selected band. The processor calculates for a given plurality of audio frames a minimum value of RMS noise energy estimated by the noise energy estimator and calculates a gain factor to be applied by the audio enhancer in the selected audio frequency band, which has over a given range a linear dependence on the minimum value calculated.

Embodiments of the present invention will now be described by way of example with reference to the accompanying drawings, in which:

DESCRIPTION OF EMBODIMENTS OF THE INVENTION

Figure 1:
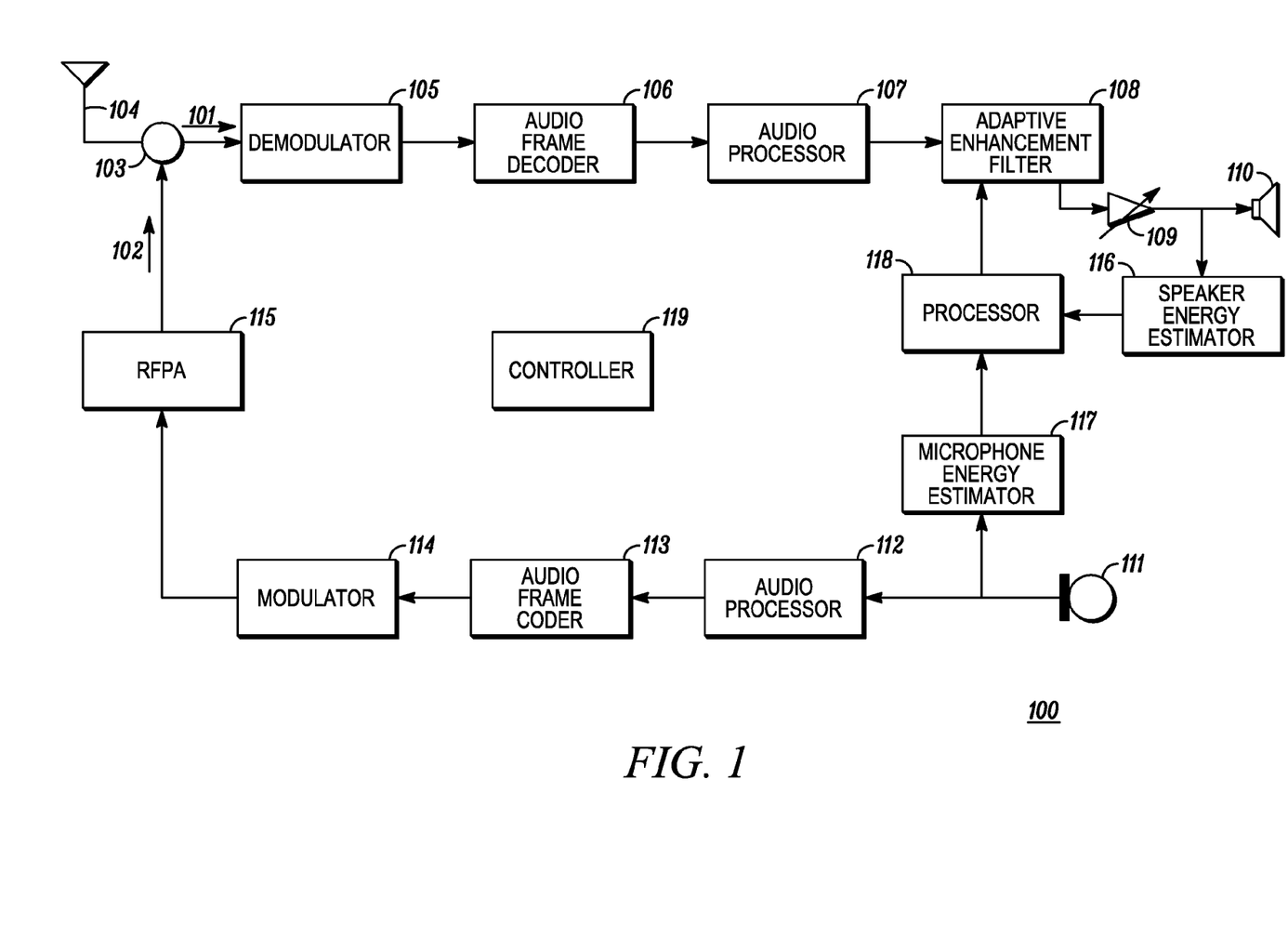
FIG. 1 is a block schematic diagram of a wireless communication terminal embodying the present invention.

FIG. 1 is a block schematic diagram of a wireless telecommunications terminal 100 embodying the present invention. The terminal 100 includes a receiver chain 101 and a transmitter chain 102. A circulator (or like device) 103 directs incoming RF signals received over the air by an antenna 104 from a distant transmitter (not shown) to the receiver chain 101. The circulator 103 also directs outgoing RF signals produced by the transmitter chain 102 to the antenna 104 for over the air delivery to a distant terminal (not shown).

The receiver chain 101 includes, connected together in turn from the circulator 103, a demodulator 105, an audio frame decoder 106, an audio processor 107, an adaptive enhancement filter 108, a variable gain amplifier 109 and a speaker 110. The demodulator 105 extracts a modulation signal carrying speech or other audio information from the received RF signal. The audio frame decoder 106 decodes the audio information frame by frame to form a digital signal representing successive frames of the audio information. The audio processor 107 carries out digital processing of the successive frames in a known manner, e.g. by applying a noise suppression algorithm, applying voice activity detection for use in automatic gain control, applying automatic filter equalizing and the like.

The adaptive enhancement filter 108 enhances a selected audio frequency band of each frame of the signal it receives from the audio processor 107 in a manner to be described later, with reference to FIGS. 3 to 5. The variable gain amplifier 109 provides volume control by a user of the signal it receives from the adaptive enhancement filter 108. Finally, the speaker 110 serves as an output audio transducer to convert the electrical signal delivered to it by the variable gain amplifier 110 into an audio signal such as reproduced speech for delivery to a user of the terminal 100.

The transmitter chain 102 includes a microphone 111 and, connected together in turn from the microphone 111 to the circulator 103, an audio processor 112, an audio frame coder 113, a modulator 114 and a RFPA (radio frequency power amplifier) 115. The microphone 111 produces an analog electrical signal representing an audio signal, e.g. speech of a user, picked up by the microphone 111. The audio processor 112 carries out digital processing of the signal. The audio frame coder 113 constructs a digital signal representing on a frame by frame basis audio information to be communicated. The modulator 114 uses the output signal from the audio frame coder 113 to produce a modulated RF signal. The modulated RF signal produced by the modulator 114 is amplified by the RFPA 115 and is delivered to the antenna 104 via the circulator 103 for over the air transmission.

A speaker energy estimator 116 estimates a value of RMS (root mean square) signal energy for each consecutive frame of the amplified signal delivered by the variable gain amplifier 109 to the speaker 110. An output signal from the speaker energy estimator 116 representing a varying RMS signal energy value estimated by the speaker energy estimator 116 is delivered to a processor 118. A microphone energy estimator 117 samples an audio input signal and/or noise delivered to the transmitter chain 102 by the microphone 111. The microphone energy estimator 117 estimates a value of RMS (root mean square) energy for each consecutive frame of the input signal and/or noise delivered by the microphone 111. An output signal from the microphone energy estimator 117 indicating the RMS energy value estimated by the microphone energy estimator 117 is delivered to the processor 118. The processor 118 operates in a manner to be described later, particularly with reference to FIG. 4, to set a value of an enhanced gain to be applied by the adaptive enhancement filter 108 in a selected audio frequency band of the signal received from the audio processor 107 by the adaptive enhancement filter 108.

The terminal 100 includes a controller 119 which controls and synchronises functional operations of the various components of the terminal 100 shown in FIG. 1. In particular, the controller 119 controls synchronisation of processing of audio frames in received and transmitted signals. Audio frames are the consecutive units into which an electrical signal representing audio information is divided in order to be processed, e.g. by a digital signal processor. Typically, the length of an audio frame is from 20 msec to 30 msec depending on the particular processing procedures to be used.

Figure 2:
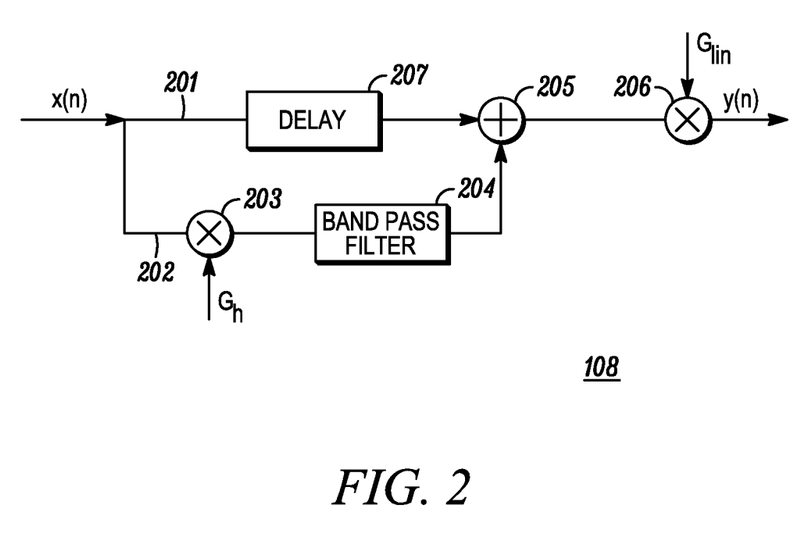
FIG. 2 is a block schematic diagram of an adaptive enhancement filter employed in the terminal of FIG. 1.

FIG. 2 is a block schematic diagram showing the adaptive enhancement filter 108 in more detail. The output signal from the audio processor 107 (FIG. 1) is shown in FIG. 2 as an input signal x(n) to the adaptive enhancement filter 108. The input signal x(n) is applied in parallel to two branches (channels) 201 and 202 included in the filter 108. The branch 201 includes a delay 207 which delays the input signal x(n) by a predetermined period equivalent to a delay required in deriving a parameter herein referred to as a gain factor $G_h$ in a manner to be described later, particularly with reference to FIG. 4. The branch 202 includes a multiplier 203 which multiplies the input signal x(n) by the gain factor $G_h$ and a band pass filter 204 which may be a linear finite impulse response (FIR) filter with N taps (where N is approximately 30 or more). The response of the filter 204 in its pass band is thereby enhanced by the gain factor $G_h$. The branches 201 and 202 are combined by a combiner 205 which adds the signals delivered and processed via the respective branches 201 and 202 to produce a combined signal. The combined signal produced by the combiner 205 is delivered to a multiplier 206 which multiplies the signal by a gain factor $G_{lin}$ to produce an output signal y(n). The gain factor $G_{lin}$ may be set to unity. Alternatively, the gain factor $G_{lin}$ may be varied adaptively in a manner to be described later so that the gain factor $G_{lin}$ adjusts the overall gain of the adaptive enhancement filter 108 to be a substantially constant overall gain, or optionally an adaptively varying overall gain, taking into account the gain factor $G_h$ applied at the multiplier 203. The output signal y(n) is applied to the speaker 110 via the variable gain amplifier 109.

Figure 3:
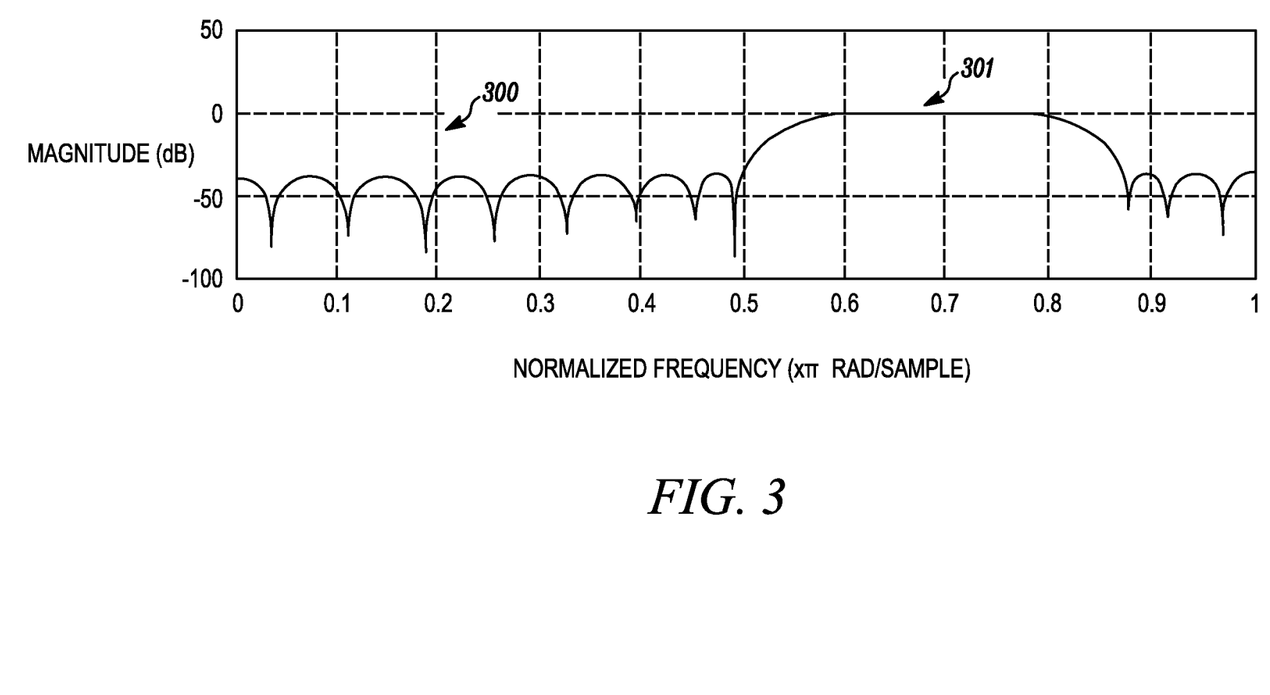
FIG. 3 is a graph of signal magnitude plotted against normalized frequency illustrating response of a band pass filter employed in the terminal of FIG. 1.

FIG. 3 is a graph showing a frequency response 300 of the band pass filter 204. The filter 204 effectively passes frequencies of the applied input signal x(n) in a pass band 301 and rejects frequencies outside the pass band 301. The pass band 301 corresponds to audio frequencies in the approximate frequency range 2 kHz to 3 kHz. The variable gain factor $G_h$ is determined adaptively in a manner to be described with reference to FIG. 4 and applied at the multiplier 203 to provide a variable enhancement of the pass band 301. Thus, the output signal y(n) is a delayed form of the input signal x(n) in which components of the signal having audio frequencies in the frequency band from about 2 kHz to about 3 kHz are emphasised by amplification compared with frequencies outside that band. This emphasis is applied without the overall power of the output signal applied to the speaker 110 being significantly increased, thereby allowing distortion of the output signal to be avoided.

Figure 4:
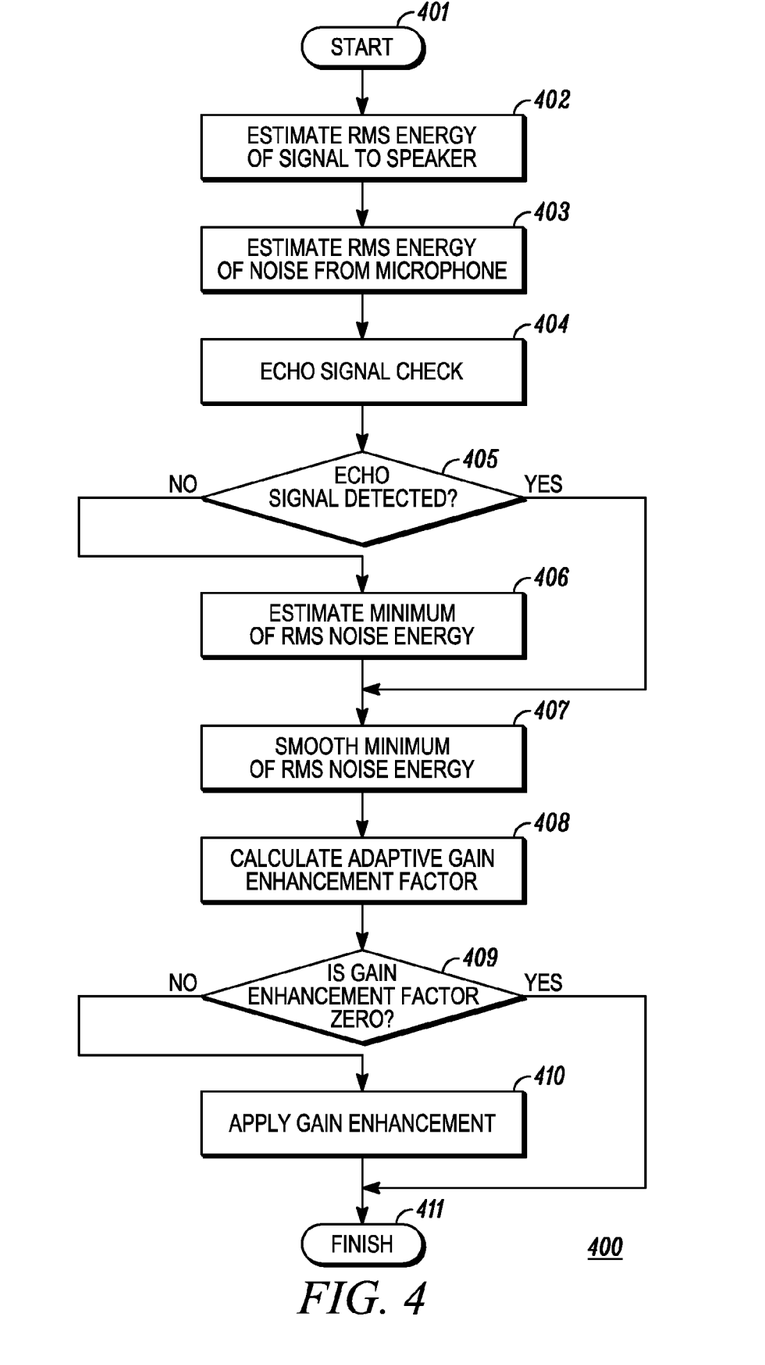
FIG. 4 is a flow chart of a method of operation embodying the present invention.

FIG. 4 is a flow chart of a method 400 of operation of the terminal 100 in accordance with an embodiment of the invention. The method 400 begins at a start step 401 which is triggered by the start of an audio frame in the received signal x(n). The start of an audio frame is indicated by the controller 119.

In a step 402 which follows the start step 401, an estimate of an RMS value of the energy of the output signal applied to the speaker 110 is found for a current audio frame by the speaker energy estimator 116. The value of the estimate is provided to the processor 118.

In a step 403 the microphone energy estimator 117 estimates for a current audio frame (synchronised with the current frame of the output signal applied to the speaker 110) an RMS value of the energy of the noise (which may include also a signal) applied at the microphone 111. The value of the estimate is provided to the processor 118.

In a step 404 the processor 118 makes a check to determine from the inputs from the estimators 116 and 117 whether an input at the microphone 111 is due to an echo of the output signal from the speaker 110. If the determination is positive ('YES'), i.e. an input at the microphone 111 is due to an echo of the output signal from the speaker 110, a flag signal is produced. If the determination is negative ('NO'), i.e. an input at the microphone 111 is not due to an echo of the output signal from the speaker 110, no flag signal is produced.

In a step 405 the processor 118 determines whether or not a flag signal was produced in step 405. If no flag signal was produced, i.e. step 405 produced a 'NO' result, a step 406 follows. If a flag signal was produced, i.e. step 405 produces a 'YES' result, a step 407 follows.

In the step 406 the processor 118 estimates a minimum value of RMS noise energy. This is done as follows. A minimum value is found from the values of RMS energy estimated in step 403 for successive frames over a predetermined number of frames, e.g. from two to ten frames, e.g. about six frames when the length of a frame is 30 msec. The minimum value found for a predetermined number of frames is used as a current minimum value for the next frame which follows the predetermined number of frames. The minimum value determined in this way is taken to be a minimum value of the RMS value of noise energy applied at the microphone 111. The reasoning for this is as follows. Since a speech signal is non-stationary (its profile changes with time) there are short gaps in the signal. Based on that knowledge the noise level may be estimated from a long enough speech signal by following the gaps in the signal. The low energy audio frames may be tracked to find a minimum energy level indicating background noise.

In the step 407 which is applied by the processor 118 to follow either step 406 or step 405, the minimum value of RMS noise energy determined in step 406 is multiplied by a smoothing factor to smooth variances of the minimum value. Step 406 is omitted where step 405 produces a 'YES' result so that the near end echo does not contribute to the smoothed minimum value of RMS noise energy obtained in step 407.

In a step 408 the processor 118 uses the smoothed minimum value of RMS noise energy estimated in step 407 to calculate a value of the gain factor $G_h$ employed as an input to the multiplier 203 as described earlier with reference to FIG. 2. This is done as follows. The processor 118 uses a function as represented by a curve 500 shown in FIG. 5 to calculate a value of $G_h$ for a given value of the RMS noise, i.e. the smoothed minimum value of RMS noise estimated in step 407. The RMS noise is plotted in FIG. 5 as A/D (analog to digital) quantization units times volts. The gain factor $G_h$ is an amount by which the gain to be applied in the selected audio frequency band is to be enhanced compared with the gain to be applied outside the selected audio frequency band, measured as multiples of the gain to be applied outside the selected audio frequency band. The curve 500 includes a sloping portion 501 which extends between a point 502 and a point 503. The curve 500 has a flat portion 504 for RMS noise values less than that at the point 502 and a flat portion 505 for RMS noise values greater than that at the point 503. The gain factor $G_h$ increases linearly in the sloping portion 501 from a minimum value at the point 502 to a maximum value at the point 503. The gain factor $G_h$ remains at the minimum value in the flat portion 504 and remains at the maximum value in the flat portion 505. The minimum value of $G_h$ is zero (i.e. no gain enhancement). The maximum value G of $G_h$ to provide suitable emphasis in the selected audio frequency band whilst avoiding distortion of the output signal is selected to be G=5 in the curve 500 as illustrated in FIG. 5.

This means that, for the maximum gain enhancement G, the gain in the selected audio frequency band 301 is enhanced by five times that outside the selected audio frequency band (equivalent to about +14 dB). Thus, for values of RMS noise greater than the minimum value, the gain factor $G_h$ is greater than zero and is selected according to the curve 500. The processor 118 may employ a lookup table to implement the function represented by the curve 500.

Figure 5:
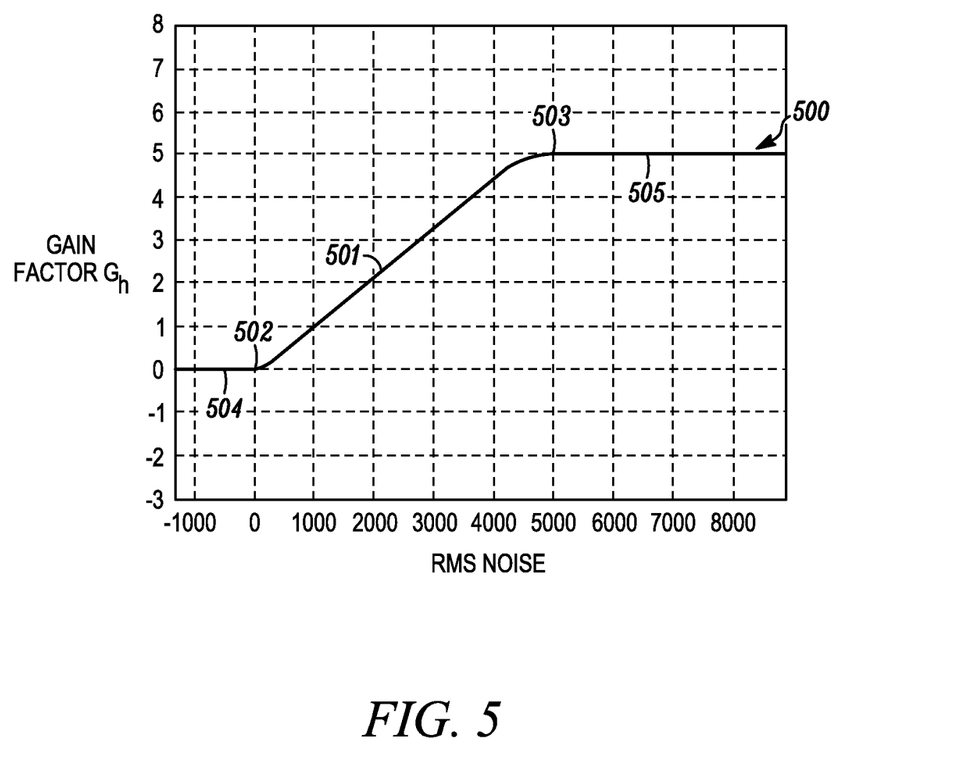
FIG. 5 is a graph of gain factor plotted against estimated noise illustrating a function employed by a processor in the terminal of FIG. 1.

Although the maximum G of gain factor $G_h$ is shown in FIG. 5 as G=5, the maximum G could be selected to be elsewhere in the range from about G=4 to about G=6.

In a decision step 409 of the method 400, the processor 118 determines whether the calculated value of the gain factor $G_h$ for the current frame is zero, a 'YES' result, or is non-zero, a 'NO' result. If decision step 409 produces a 'YES' result, the method 400 proceeds to a finish step 411. If decision step 409 produces a 'NO' result, the method 400 proceeds to a step 410 in which the value of the gain factor $G_h$ calculated by the processor 118 is applied to the multiplier 203 of the filter 208 (FIG. 2), thereby giving a gain enhancement of the signal x(n) in the pass band 301 of the band pass filter 204. The finish step 411, in which the method ends, follows step 410.

Where the gain factor $G_{lin}$ applied to the multiplier 206 (FIG. 2) is calculated to adjust the overall gain of the filter 108 adaptively to be a substantially constant overall gain, the processor 118 shown in FIG. 1 may be employed to calculate the gain $G_{lin}$. The processor 118 may carry out this calculation using the following relationships:

$Eh = \|G_{lin}.(Gh.s(n)*h(n)+x(n)\|^2$ $Es = \|s(n)\|^2$ $G_{lin} = (Es/Eh)^{1/2}$ where Eh is the received signal energy after the filter 108, Es is the received signal energy before the filter 108, h(n) is the impulse response of the band pass filter 108 and x(n) is the input signal magnitude. The values of Es and Eh may be estimated by energy estimators (not shown) similar to the estimators 116 and 117.

The embodiments of the invention described above provide a very satisfactory solution to the problem of near-end ambient noise in the environment of a telecommunications terminal. The amplification of the received electrical signal representing audio information in a selected audio frequency band, e.g. above 1 kHz, particularly about 2 kHz to about 3 kHz, provides enhancement of the signal in this band to allow better intelligibility of the signal when delivered to a user by the speaker 110. The amount of enhancement applied, up to a maximum enhancement, is determined adaptively based upon an estimation of the energy level of the ambient noise. The maximum gain enhancement is selected to be at a level which avoids distortion of the received signal. The enhancement applied in the selected audio frequency band is unlikely to make a significant increase in the overall power consumed to deliver the received signal to the speaker 110.

The embodiments of the invention can be implemented easily and inexpensively and require much less computing power and memory capacity in use than systems such as that of the prior art which analyse the spectrum of the received signal. Furthermore, the embodiments of the invention can beneficially be implemented so that changes to gain enhancement in the selected audio frequency band required because of changes in near-end background noise levels can be calculated and applied rapidly.

The terminal in the embodiments of the invention which have been described can be used in a number of applications such as a mobile telephone, a portable radio, a vehicle carried radio or a landline telephone apparatus. Furthermore, the embodiments of the invention are useful in various call modes such as dispatch call mode, speaker phone mode, ear speaker mode as well as normal telephone mode. Different levels of echo can be produced depending on the mode of use, but as described earlier, the echo can be detected so that it is not included in near end noise estimates.

The invention claimed is:

1. A telecommunications terminal including:
an input audio transducer,
a receiver for receiving an electrical signal representing a transmitted audio signal,
a noise energy estimator for estimating an audio noise energy input received by the input audio transducer,
an audio enhancer for applying to the received electrical signal in a selected audio frequency band in the range of from about 2 kHz to about 3 kHz a first gain which is greater than a second gain applied to audio frequencies of the received electrical signal outside the selected band, and
a processor operable to calculate, for each of a given plurality of audio frames of the audio noise energy input preceding a current audio frame, a value of RMS noise energy estimated by the noise energy estimator, to select a minimum value of RMS noise energy out of the calculated values of RMS noise energy, and to calculate a gain factor, to be applied to the current audio frame of the transmitted audio signal by the audio enhancer in the selected audio frequency band as a function of the selected minimum value of RMS noise energy.

2. A terminal according to claim 1 including:
an output audio transducer operable to receive an output signal from the audio enhancer and to convert the signal into an output audio signal.

3. A terminal according to claim 2 wherein the terminal includes a transmitter operable to receive from the input audio transducer an electrical signal provided to the input audio transducer and to convert the electrical signal into a communication signal.

4. A terminal according to claim 3 wherein the audio enhancer is operable to enhance the gain applied to the received electrical signal in the same selected audio frequency band for all values of the estimated audio noise energy input above a minimum value.

5. A terminal according to claim 4 wherein the audio enhancer is operable to apply, for audio frequencies outside the selected audio frequency band, substantially zero gain enhancement.

6. A terminal according to claim 5 wherein the audio enhancer is operable to apply gain enhancements up to a maximum gain enhancement of G where G is in the range 4 to 6 times the gain applied to audio frequencies outside the selected audio frequency band.

7. A terminal according to claim 6 wherein the processor is operable to apply a smoothing factor to variations in the minimum value of RMS noise energy calculate to produce a smoothed value of minimum RMS noise energy and to calculate the gain enhancement to be applied in the given audio frequency band as a function of the smoothed value of minimum RMS noise energy.

8. A terminal according to claim 7 further including an output signal energy estimator for calculating an energy level of an output signal provided by the audio enhancer to the output audio transducer and wherein the processor is operable to compare the calculated energy level provided by the output signal energy estimator and an audio noise energy input received by a microphone energy estimator to detect when an echo signal from the output audio transducer is received at the input audio transducer and to exclude the detected echo signal from the audio noise energy input.

9. A terminal according to claim 8 wherein the audio enhancer is operable to apply a finite gain enhancement to the received electrical signal in the selected audio frequency band only when an output volume level of the received electrical signal is at a maximum.

10. A terminal according to claim 9 wherein the audio enhancer includes a first channel including means operable to apply a gain enhancement to the received electrical signal in the selected audio frequency band, a second channel in parallel with the first channel and including means operable to delay the received electrical signal and a combiner operably connecting the first and second channels to produce a combined signal from the first and second channels.

11. A terminal according to claim 10 wherein the first channel includes an applier to apply an adaptively determined gain to an electrical signal received thereby and a band pass filter operable to filter an electrical signal received thereby to pass substantially a signal having the selected audio frequency band.

12. A terminal according to claim 11 wherein the band pass filter is operable to receive an output signal provided by the applier an adaptively determined gain.

13. A terminal according to claim 12 wherein the audio enhancer includes, operably connected to the combiner to receive the combined signal produced by the combiner, an adaptive applier that applies an adaptively determined gain to the combined signal, wherein the adaptively determined gain is calculated to keep the overall gain of the audio enhancer substantially constant or to follow an adaptively determined variation.

14. A terminal according to claim 1, wherein the gain factor rises linearly as a function of a rise in the calculated minimum value of RMS noise energy.

15. A method of operation in a telecommunications terminal including:
  receiving by a receiver of the terminal an electrical signal representing a transmitted audio signal,
  receiving by an input audio transducer an input including background noise,
  estimating by a noise estimator an audio noise energy of the input received by the input audio transducer,
  calculating by a processor a gain enhancement to be applied by an audio enhancer to the received electrical signal in a selected audio frequency band in the range of from about 2 kHz to about 3 kHz, and
  applying by the audio enhancer the calculated gain enhancement to the received electrical signal in the selected audio frequency band and not outside the selected audio frequency band,
  wherein the processor calculates, for each of a given plurality of audio frames of the input preceding a current audio frame preceding a current audio frame, a value of RMS noise energy estimated by the noise energy estimator, selects a minimum value of RMS noise energy out of the calculated values of RMS noise energy, uses the selected minimum value of RMS noise energy to select a gain factor to be applied to the transmitted audio signal by the audio enhancer in the selected audio frequency band, the gain factor selected as a function of the selected minimum value of RMS noise energy.

16. A method according to claim 15, wherein the gain factor rises linearly as a function of a rise in the calculated minimum value of RMS noise energy.

* * * * *